United States Patent [19]
Turi et al.

[11] Patent Number: 5,548,234
[45] Date of Patent: Aug. 20, 1996

[54] SYSTEM AND METHOD FOR CONTROL OF A POCKEL'S CELL

[75] Inventors: Laszlo Turi; Richard Ujazdowski, both of San Diego; Tibor Juhasz, Irvine, all of Calif.

[73] Assignee: Intelligent Surgical Lasers, Inc., San Diego, Calif.

[21] Appl. No.: 361,739

[22] Filed: Dec. 21, 1994

[51] Int. Cl.$^6$ .................................................. H03K 3/00
[52] U.S. Cl. ........................... 327/108; 359/257; 372/10; 372/12; 372/27
[58] Field of Search .................... 327/108, 111, 327/181, 183, 365, 374, 375, 376, 377, 109, 110; 359/257, 262; 372/9, 10, 12, 17, 25–27

[56] References Cited

U.S. PATENT DOCUMENTS

| | | | |
|---|---|---|---|
| 3,572,897 | 3/1971 | Bousky | 359/245 |
| 3,653,743 | 4/1972 | Kiefer et al. | 359/254 |
| 3,663,091 | 5/1972 | Lee | 359/245 |
| 3,789,241 | 1/1974 | Hess, Jr. | 327/375 |
| 4,620,113 | 10/1986 | Sizer, II et al. | 327/111 |
| 4,629,993 | 12/1986 | Bouvier et al. | 327/126 |
| 4,704,548 | 11/1987 | Strong et al. | 327/374 |
| 4,896,119 | 1/1990 | Williamson et al. | 330/4.3 |
| 5,016,251 | 5/1991 | D'Arcy | 372/10 |
| 5,119,383 | 6/1992 | Duling, III et al. | 372/18 |
| 5,221,988 | 6/1993 | Juhasz | 359/247 |
| 5,394,415 | 2/1995 | Zucker et al. | 372/26 |

*Primary Examiner*—John S. Heyman
*Assistant Examiner*—Kenneth B. Wells
*Attorney, Agent, or Firm*—Nydegger & Associates

[57] ABSTRACT

A two-step solid state optical switch system includes an electro-optical material positioned between a first electrode and a grounded second electrode. A voltage source is electrically connectable to the first electrode by an ON switch. When the ON switch is closed, a plurality of field effect transistors establish electrical contact between the voltage source and the first electrode to charge the first electrode and change the optical characteristics of the electro-optical material. An OFF switch, which is also electrically connectable to the first electrode, includes a plurality of field effect transistors, which establish electrical contact between ground and the first electrode when the OFF switch is closed. With the closing of the OFF switch, any voltage on the first electrode is removed to restore the optical characteristics of the electro-optical material. Electronic components of the system selectively activate the ON switch and the OFF switch in a sequence so that both switches are never simultaneously closed.

16 Claims, 2 Drawing Sheets

SYSTEM AND METHOD FOR CONTROL OF A POCKEL'S CELL

FIELD OF THE INVENTION

The present invention pertains generally to optical switching systems. More particularly, the present invention pertains to optical switching systems which rely on changing the polarization of a light beam as it passes through an electro-optical material to block the transmission of the polarized light beam through a polarizer. The present invention is particularly, but not exclusively, useful as an optical switching system for the regenerative amplifier of an apparatus which generates a pulsed laser beam.

BACKGROUND OF THE INVENTION

The use of electro-optical materials to switch polarized laser beams between an on condition and an off condition is well known. Electro-optical materials are useful for this purpose because they are capable of changing the polarization of a light beam in response to the application of an electrical voltage across the material. Depending on the nature of the electro-optical material, its size, and the amount of voltage which is applied to the material, the polarization of a light beam can be varied to selectively pass a polarizer which has a predetermined polarization orientation.

When used in a regenerative amplifier, an electro-optical material is commonly referred to as a Pockels' Cell and functions generally as follows. Initially, the Pockels' Cell is nominally in an OFF condition. While the Pockels' Cell is in the OFF condition, a laser medium in the regenerative amplifier cavity of the apparatus is "pumped" to generate an excess of excited atoms in the medium. After the medium has been "pumped" the Pockels' Cell is then switched to an ON condition to capture an unamplified ultra-short laser pulse in the cavity. While in the cavity, the captured pulse is reflected back and forth through the laser medium to amplify the pulse. This amplification process takes approximately 300 nanoseconds, after which, the Pockels' Cell is again switched to an OFF condition to "dump" the amplified pulse from the cavity.

To effectively perform the function of a Pockels' Cell, the polarization of a laser beam which passes the electro-optical material needs to be selectively changed from the OFF condition to the ON condition, and from the ON condition back to an OFF condition. These changes in condition must be accomplished within a time span of approximately 4 or 5 nanoseconds in response to the selective application of an electrical voltage across the material. Preferably, at least for a regenerative amplifier, the voltage will alter the characteristics of the electro-optic material so that it changes a linearly polarized light to a circularly polarized light which is frequently referred to as quarter wave polarization shift. With such alterations, polarized laser light which was previously unable to pass freely through the polarizer (i.e. an OFF condition) can now do so (i.e. an ON condition), and vice versa.

Typically, in order to alter the polarization of the laser light using a Pockels' Cell, a relatively large voltage is required to be switched between the two electrodes of the electro-optic crystal. Also, once a voltage is applied, it is not a simple matter to remove the voltage from the material and thereby restore the characteristics of the Pockels' Cell to the state or condition it was in before application of the voltage.

Heretofore, due to the capacitive nature of a Pockels' Cell, and the requirement for very rapid changes in the polarization of the laser beam, it has been easier to apply successive voltages to the Pockels' Cell rather than apply and then remove a voltage. Thus, to switch a Pockels' Cell through an OFF/ON/OFF cycle, a quarter wavelength voltage was first applied to the electro-optical material to change the Pockels' Cell from OFF to ON. A double quarter wavelength voltage was then subsequently applied to the electro-optical material to change the Pockels' Cell from ON to OFF. The double voltage was then allowed to dissipate in order to return the Pockels' Cell to its pre-cycle state. Unfortunately, this double voltage causes greater acoustical disturbance for the Pockels' Cell, requires more power and, consequently, generates more heat. Moreover, during dissipation of the voltage, the Pockels' Cell transitions the ON condition for a second time, and this allows partially amplified light to leak from the pulsed laser beam generating apparatus. Such leakage disturbs the pulsed laser beam and diminishes the efficacy of the apparatus for its intended purpose. Furthermore, depending on the particular application, the leakage can cause injury.

The present invention recognizes that a switch driver system for an electro-optical material can be provided which effectively applies and removes a voltage from the material to allow for the generation of sharp changes in the polarization of the passing laser light. Further, the present invention recognizes that such a switch driver system can effectively operate between only two conditions. One condition being wherein a voltage is applied to the electro-optical material to establish a first optical transmission characteristic for the material, and the other condition being wherein the voltage is removed from the electro-optical material to establish a second optical transmission characteristic for the material.

In light of the above, it is an object of the present invention to provide a two-step optical switch driver system which helps minimize the acoustical disturbance of the electro-optical material. Another object of the present invention is to provide a two-step optical switch driver system which has reduced power requirements and, thus, generates less heat in the system. Still another object of the present invention is to provide a two-step optical switch driver system which avoids transmission of an ON condition wherein unwanted laser light leakage can occur. Another object of the present invention is to provide a two-step optical switch driver system which has a very sharp turn on and turn off capability in order to capture very short duration laser pulses from a laser pulse train having a very high repetition rate. Yet another object of the present invention is to provide a two-step optical switch which is relatively simple to manufacture, easy to use and comparatively cost effective.

SUMMARY OF THE PREFERRED EMBODIMENTS OF THE INVENTION

A two-step solid state optical switch driver system includes an electro-optical material, such as a Pockels Cell, which is positioned between an electrode and ground. A voltage source is provided, and an ON switch is electronically connected between the voltage source and the electrode of the electro-optical material. Upon activation of the ON switch, a voltage from the voltage source is applied to the electrode which changes the polarization characteristics of the laser beam passing through the electro-optical material from a first state to a second state.

An OFF switch is also provided which is electronically connected between the electrode of the electro-optical switch and ground. Upon activation of the OFF switch, the electrode is immediately connected to ground to remove voltage from the electrode.

For the present invention, the ON switch further includes a pulse transformer which is electronically connected to a plurality of Field Effect Transistors (FETs). Similarly, the OFF switch includes a pulse transformer which is electronically connected to a plurality of FETs. The OFF switch also includes a filter system which is electronically connected between the electrode of the electro-optical material and the FETS of the OFF switch to electrically isolate the OFF switch from the ON switch.

In the operation of the two-step optical switch of the present invention a trigger voltage is applied to the pulse transformer of the ON switch to connect the voltage source with the electrode. This voltage causes the electro-optical material to change the polarization characteristics of the transmitting through laser beam by approximately one quarter wavelength ($\lambda/4$). After approximately one hundred nanoseconds, the on switch is deactivated and begins to open. From any time approximately one hundred nanoseconds after the ON switch has been activated, a trigger voltage for the OFF switch can be applied to the pulse transformer of the OFF switch to activate and thereby close the OFF switch.

Closure of the OFF switch electrically connects the electrode of the electro-optical material with ground to remove voltage from the electrode. With the voltage removed from the electrode, the polarization characteristics of the laser beam passing the electro-optical material are restored to the previous condition wherein the polarization of the beam is no longer rotated one quarter of a wavelength. Subsequent activation of the ON switch will cause the electro-optical switch to again be changed by one quarter of a wavelength, and thereby initiate another switching cycle.

BRIEF DESCRIPTION OF THE DRAWINGS

The novel features of this invention, as well as the invention itself, both as to its structure and its operation will be best understood from the accompanying drawings, taken in conjunction with the accompanying description, in which similar reference characters refer to similar parts, and in which.

BRIEF DESCRIPTION OF THE PREFERRED EMBODIMENTS

Figure 1:
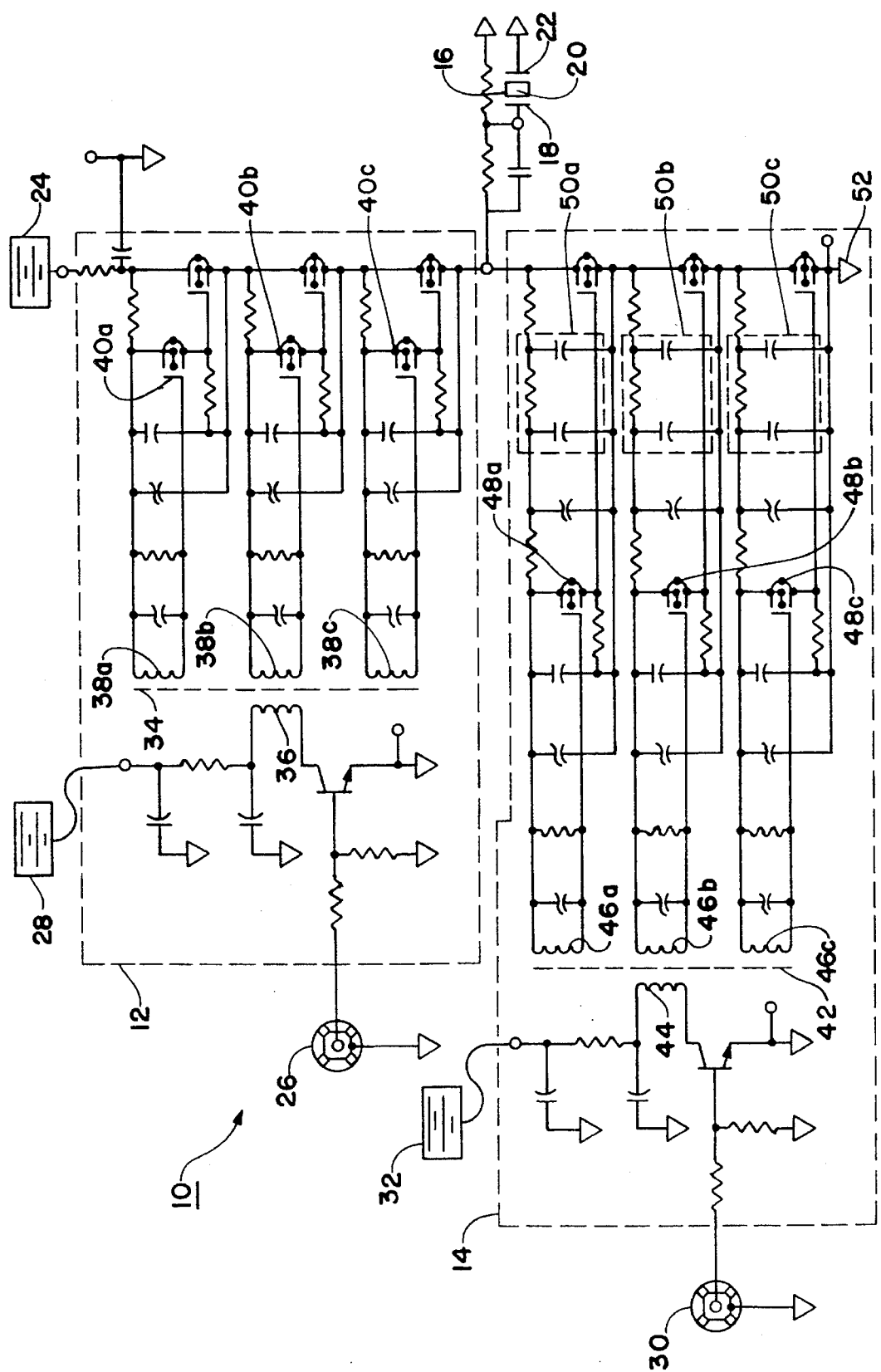
FIG. 1 is a schematic wiring diagram for the electronic components of the two-step optical switch driving system of the present invention.

Referring initially to FIG. 1, a schematic wiring diagram of the two-step solid state optical switching system of the present invention is shown and generally designated 10. As shown, the system 10 of the present invention includes an ON switch 12 and an OFF switch 14 which are both electrically connected to a Pockels' Cell 16. Specifically, cell 16 includes a first electrode 18, an electro-optical material 20, and a second electrode 22. For purposes of the present invention, the first electrode 18 is electrically connected to both the ON switch 12 and the OFF switch 14, while the second electrode 22 is connected directly to ground. The electro-optical material 20 may be of any type well known in the pertinent art having piezoelectric properties which change the optical transmission characteristics of the material 20 in response to the application of a voltage to the material 20. Thus, the material 10 can be altered to either transmit or block the passage of a light beam 23 from a light source 25 as it passes through the cell 16.

A voltage source 24 and a trigger source 26 are connected to ON switch 12 substantially as shown in FIG. 1, and a voltage source 28 is provided as part of the ON switch 12. For the system 10, voltage source 24 is provided to supply sufficient voltage to first electrode 18 of the Pockels' Cell 16 to appropriately change the polarization characteristics of the transmitted laser beam as desired. The amount of voltage which is supplied by voltage source 24 depends on several factors. These include the size of the crystal material 20 and the extent of change desired in the polarization of the transmitted laser beam. Typically, the voltage from voltage source 24 will be around three thousand volts (3 kV). On the other hand, trigger source 26 will be much smaller than voltage source 24 as its function is to initiate activation of the ON switch 12. This requires only about four volts (4 V). Actual activation of the ON switch, however, is accomplished with power from voltage source 28 which will supply a voltage that is approximately equal to four hundred volts (400 V).

OFF switch 14 is shown in FIG. 1 to be connected to a trigger source 30 and to include a voltage source 32. The trigger source 30 is provided to initiate activation of OFF switch 14 in a manner similar to the function of trigger source 26 for ON switch 12. Accordingly, the voltage of trigger source 30 will be approximately four volts. Further, like voltage source 28, the voltage source 32 is provided to actually activate the OFF switch 14. Accordingly the voltage of voltage source 32 will be approximately equal to four hundred volts (400 V).

FIG. 1 shows that the ON switch 12 includes a transformer 34. Specifically, transformer 34 includes a primary winding 36 which is electronically connected to voltage source 28, and a plurality of secondary windings 38a, 38b and 38c. Further, FIG. 1 shows that the secondary windings 38a–c are electronically connect to respective field effect transistors (FETs) 40a–c. These FETs 40a–c are each, in turn, connected between the voltage source 24 and the first electrode 18 of Pockels' Cell 16.

In an arrangement somewhat similar to ON switch 12, the OFF switch 14 includes a transformer 42 which has a primary winding 44 that is electronically connected to voltage source 32. OFF switch 14 is also shown in FIG. 1 to include a plurality of secondary windings 46a, 46b and 46c which are electronically connected to respective FETs 48a–c. Additionally, each FET 48 of OFF switch 14 is isolated from first electrode 18 of Pockels' Cell 16 by a respective filter 50a–c. More specifically, the filters 50a–c are shown to be between the first electrode 18 and a ground 52.

OPERATION

Figure 2:
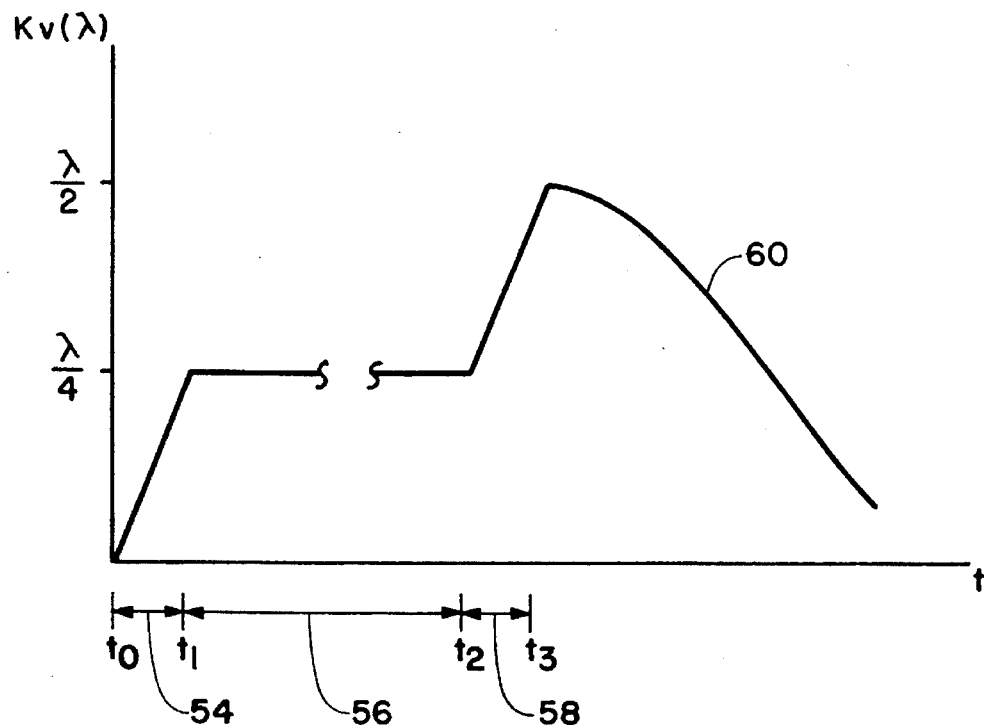
FIG. 2 is a graph showing the change in optical characteristics of a prior art optical switch over a switching cycle.

The operation of the two-step solid state optical switch driver system 10 of the present invention will, perhaps, be best understood with a brief reference to FIG. 2 and an alternate method for switching electro-optical material between an "on" condition and an "off" condition. For the example shown, the change in polarization is indicated to be a quarter wavelength (λ/4) to correspond with the typical change used for an electro-optical switch. In FIG. 2, a known method for such a switching operation is illustrated wherein at a time $t_O$ a voltage is applied to the electro-optical material. At a time $t_1$ after a time interval 54, which is approximately four nanoseconds (4 nsec), the λ/4 change has been accomplished. At time $t_2$, after a predetermined time interval 56, additional voltage is applied to the electro-optical material to change its optical transmission characteristics by an additional λ/4. The total change at time $t_3$ is now λ/2. At $t_3$, the voltage is removed from the material in order to have the electro-optical material return to the condition it was in at $t_0$. For the reasons set forth above, this procedure has several significant drawbacks.

In accordance with the present invention, the system 10 operates as follows. First, at a predetermined time $t_O$ when OFF switch 14 is open, the trigger source 26 is operatively connected to ON switch 12. This action connects voltage source 28 with the primary winding 36 of transformer 34. An electrical current is thereby induced in the secondary windings 38a-c, and the corresponding FETs 40a-c are activated to close the ON switch 12. With the closing of ON switch 12, voltage source 24 is directly connected with first electrode 18 of Pockels' Cell 16. The result is that with voltage from voltage source 24, the polarization characteristics of the beam passing the electro-optical material 20 are changed by λ/4. This process of applying the voltage from voltage source 24 to first electrode 18 and making the λ/4 change the beam requires approximately four nanoseconds (4 nsec). At time $t_1$, when the λ/4 voltage change has been completed, the ON switch 12 then begins to open since its gate electrode is connected to its source electrode through a resistor.

Figure 3:
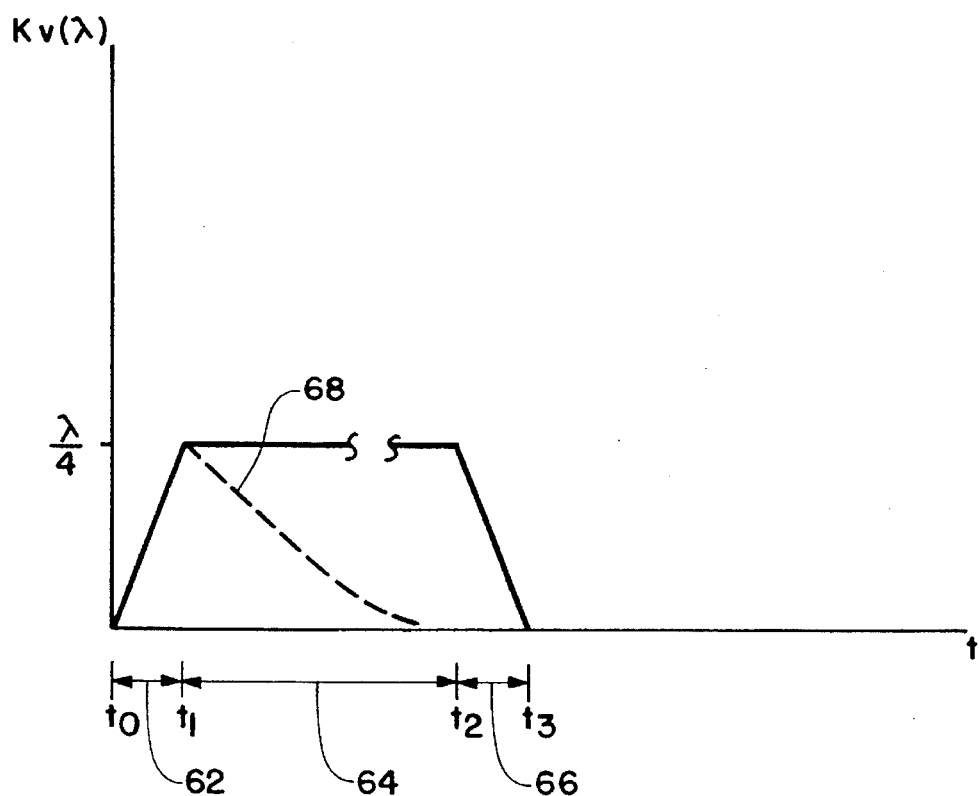
FIG. 3 is a graph showing the change in optical characteristics of an optical switch according to the present invention over a switching cycle.

Still referring to FIG. 3, it will be seen that a time interval 64 follows $t_1$ which extends to a time $t_2$ when OFF switch 14 is activated. During time interval 64, which is preferably about three hundred nanoseconds in duration, the material 20 will effectively retain the λ/4 change caused by voltage from voltage source 24. At time $t_2$, however, the OFF switch is activated and the polarization characteristics of the laser beam are again changed. Specifically, at a predetermined time $t_2$, trigger source 30 is connected with OFF switch 14. This, in turn, connects voltage source 32 with the primary winding 44 of transformer 42. The consequent current induced in secondary windings 46a–c activates respective FETs 48a–c to connect the first electrode 18 of Pockels' Cell 16 with ground 52. The result, as indicated in FIG. 3, is that during the time interval 66 between $t_2$ and $t_3$ voltage is removed from the first electrode 18. With this removal of the voltage, the electro-optical material 20 is returned through a λ/4 change to the same condition it was in at the time $t_O$ before the initiation of the on/off cycle.

The times $t_0$, for initial activation of ON switch 12, and $t_2$, for initial activation of OFF switch 14 are arbitrary. As a practical matter, however, the time between initial activation of these switches (i.e. intervals 62 and 64) will total approximately 200 nanoseconds or longer. This is so for two reasons.

First, time must be given for ON switch 12 to reopen before OFF switch 14 is closed. For obvious reasons, it is very important that ON switch 12 and OFF switch 14 not (emphasis added) be closed at the same time. As shown by dashed line curve 68 in FIG. 3, however, the reopening of ON switch 12 occurs relatively slowly. In fact, it can take up to around 100 nanoseconds for ON switch 12 to reopen. What this means is that there is a necessary lapse after ON switch 12 begins to reopen before the OFF switch 14 can be activated.

Second, importantly for the purposes of the present invention, a system 10 necessarily keeps a λ/4 change on material 20 of the Pockels' Cell 16 for approximately 300 nanoseconds. This is so in order to keep a laser pulse captive in the regenerative amplifier cavity of a pulsed laser beam generator (not shown) for its amplification. As shown in FIG. 3, after the λ/4 change has been completed and even though ON switch 12 is reopened, the λ/4 change will be substantially maintained during the time interval 64.

In accordance with system 10 of the present invention, the cycles of activation between ON/OFF/ON can be repeated as often as is necessary. As shown in FIG. 1, this can be accomplished by a cycle timer 70, of a type well known in the art. Further, subject to limitations mentioned above, the frequency of cycles can be such that a cycle is accomplished approximately every 200 nanoseconds.

While the particular two-step solid state optical switch driver system as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

We claim:

1. A two-step solid state electro-optical switch driver system for rotating the polarization of a light beam which comprises:

a first voltage source for generating a first voltage;

an electro-optical material positioned along the path of said light beam, said electro-optical material being electrically connected between a first electrode and a second electrode, said second electrode being connected to ground;

an ON switch for selectively connecting said voltage source with said first electrode to place said first voltage across aid electro-optical material and change the optical characteristics thereof from a first state to a second stage to rotate the polarization of said light beam; and an OFF switch including a first plurality of field effect transistors for selectively connecting said first electrode of said electro-optical material to ground to remove said first voltage therefrom to return the optical characteristics of said electro-optical material to said first state, and a plurality of electronic filters, wherein each filter is connected across a corresponding one of each said field effect transistors.

2. The driver system as recited in claim 1 wherein said rotation measures approximately one quarter of a wavelength (λ/4).

3. The driver system as recited in claim 1 wherein said ON switch comprises:

a pulse transformer having a primary winding and a secondary winding;

a second voltage source for generating a second voltage, said second voltage source being electrically connected to said primary winding of said pulse transformer; and a second plurality of field effect transistors, each said field effect transistor being electrically connected to said secondary winding of said pulse transformer, said first voltage source, and said first electrode.

4. The driver system as recited in claim 3 wherein said OFF switch further comprises:

a pulse transformer having a primary winding and a secondary winding; and a third voltage source for generating a third voltage, said third voltage source being electrically connected to said primary winding of said pulse transformer.

5. A two-step solid state optical switch driver system which comprise:

an electro-optical material positioned along the path of a light beam, said electro-optical material being electrically connected between a first electrode and a second electrode, said second electrode being connected to ground; and electrical means for selectively changing the optical characteristics of said material between a first state wherein the polarization of said light beam is substantially unaffected, and a second state, wherein the polarization of said light beam is rotated by approximately one quarter of a wavelength ($\lambda/4$), and wherein said means includes an OFF switch for connecting said first electrode of said electro-optical material to ground to remove said first voltage therefrom to return the optical characteristics of said electro-optical material to said first state, and wherein said OFF switch includes a first plurality of field effect transistor and a plurality of electronic filters, wherein each filter is connected across a corresponding one of each said field effect transistors.

6. The driver system as recited in claim 5 wherein said electric means further comprises:

a first voltage source for generating a first voltage; and an ON switch for connecting said first voltage source with said first electrode to place said first voltage across said electro-optical material and change the optical characteristics thereof from said first state to said second state.

7. The driver system as recited in claim 6 further comprising means for alternately activating said ON switch and said OFF switch.

8. The driver system as recited in claim 7 wherein said ON switch comprises:

a pulse transformer having a primary winding and a secondary winding;

a second voltage source for generating a second voltage, said second voltage source being electrically connected to said primary winding of said pulse transformer; and a second plurality of field effect transistors, each said field effect transistor being electrically connected to said secondary winding of said pulse transformer, said first voltage source, and said first electrode.

9. The driver system as recited in claim 8 wherein said OFF switch further comprises:

a pulse transformer having a primary winding and a secondary winding;

a third voltage source for generating a third voltage, said third voltage source being electrically connected to said primary winding of said pulse transformer; and a plurality of field effect transistors, each said field effect transistor being electrically connected to ground, to said secondary winding of said pulse transformer, and said first electrode.

10. The driver system as recited in claim 9 further comprising means for selectively activating said second voltage source of said ON switch and said third voltage source of said OFF switch.

11. The driver system as recited in claim 10 wherein said electro-optical material is an electro-optic crystal.

12. A method for operating a two-step optical switch having an electro-optical material positioned along the path of a light beam, said electro-optical material being electrically connected between an electrode and ground, the method comprising the steps of:

placing a voltage from a first voltage source on said electrode to change the optical characteristics of said electro-optical material to rotate the polarization of said light beam by approximately one quarter of a wavelength ($\lambda/4$) said placing step being accomplished by activating an ON switch, said ON switch comprising a pulse transformer having a primary winding and a plurality of secondary windings, a second voltage source for generating a second voltage, said second voltage source being electrically connected to said primary winding of said pulse transformer, and a first plurality of field effect transistors each said field effect transistor being electrically connected across a corresponding one of plurality of said secondary windings; and removing said voltage from said first electrode to directly restore the optical characteristics exhibited by said electro-optical material prior to said placing step said removing step being accomplished by activating an OFF switch, said OFF switch comprising a pulse transformer having a primary winding and a plurality of secondary windings, a third voltage source for generating a voltage, said voltage source being electrically connected to said primary winding of said pulse transformer, and a plurality of field effect transistors, each said field effect transistor being electrically connected across a corresponding one of said plurality of second windings.

13. The method as recited in claim 12, wherein said voltage placed on said electrode to change the optical characteristics of said electro-optical material is approximately three thousand volts (3 KV).

14. The method as recited in claim 13 wherein the time duration between initiation of said placing step and initiation of said removing step is at least two hundred nanoseconds (200 nsec).

15. The method as recited in claim 14 further comprising the step of alternately activating said ON switch and said OFF switch.

16. The method as recited in claim 15 wherein said electro-optical material is a piezoelectric crystal.

* * * * *